United States Patent
Voloshynovskiy et al.

(10) Patent No.: US 11,126,896 B2
(45) Date of Patent: Sep. 21, 2021

(54) SIGNAL SAMPLING WITH JOINT TRAINING OF LEARNABLE PRIORS FOR SAMPLING OPERATOR AND DECODER

(71) Applicant: Université de Genève, Geneva (CH)

(72) Inventors: Sviatoslav Voloshynovskiy, Vésenaz (CH); Olga Taran, Petit-Lancy (CH); Taras Holotyak, Geneva (CH); Martino Ferrari, Parma (IT); Karen Eguiazarian, Tampere (FI)

(73) Assignee: Université de Genève, Geneva (CH)

( * ) Notice: Subject to any disclaimer, the term of this patent is extended or adjusted under 35 U.S.C. 154(b) by 106 days.

(21) Appl. No.: 16/547,373

(22) Filed: Aug. 21, 2019

(65) Prior Publication Data
US 2020/0074244 A1 Mar. 5, 2020

(30) Foreign Application Priority Data
Aug. 29, 2018 (EP) ..................... 18191494

(51) Int. Cl.
*G06K 9/62* (2006.01)
*G06T 9/00* (2006.01)

(52) U.S. Cl.
CPC ......... *G06K 9/6268* (2013.01); *G06K 9/6257* (2013.01); *G06K 9/6265* (2013.01); *G06T 9/00* (2013.01)

(58) Field of Classification Search
None
See application file for complete search history.

(56) References Cited

U.S. PATENT DOCUMENTS

| 2010/0215282 A1* | 8/2010 | Van Beek ................. G06T 5/50 382/255 |
| 2017/0109650 A1 | 4/2017 | Cevher et al. |

(Continued)

OTHER PUBLICATIONS

Y. Han and J. C. Ye, "k-space deep learning for accelerated MRI," CoRR, vol. abs/1805.03779, 2018. (Year: 2018).*

(Continued)

*Primary Examiner* — Andrae S Allison
(74) *Attorney, Agent, or Firm* — Christensen, Fonder, Dardi & Herbert PLLC

(57) ABSTRACT

A method of sampling and decoding of a signal of interest x comprising, at a training stage: acquiring a set of training signals $\{x_i\}_{i=1}^M$, providing a sampling operator $P_\Omega$ and a decoder $g_{\theta_g}(.)$, training operator $P_\Omega$ on signals $\{x_i\}_{i=1}^M$ to obtain a learned sampling operator $P_{\hat{\Omega}}$; and, at a sampling stage: applying $P_{\hat{\Omega}}$ in a transform domain $\Psi$ to signal x, resulting in observation signal y; applying the decoder $g_{\theta_g}(.)$ to y, to produce an estimate $\hat{x}$ of signal x to decode and/or, decide about, the signal. Decoder $g_{\theta_g}(.)$ is trained jointly with $P_\Omega$ on signals $\{x_i\}_{i=1}^M$, to obtain a learned decoder $g_{\hat{\theta}_g}$, by jointly determining, during a cost minimization step, sampling parameters $\Omega$ and decoding parameters $\theta_g$ according to a cost function, and wherein the step of applying the decoder $g_{\theta_g}(.)$ uses decoding parameters $\hat{\theta}_g$, such that estimate $\hat{x}$ is produced by the learned decoder $g_{\hat{\theta}_g}$.

17 Claims, 8 Drawing Sheets

(56) References Cited

U.S. PATENT DOCUMENTS

| | | | |
|---|---|---|---|
| 2019/0171929 A1* | 6/2019 | Abadi | G06N 3/084 |
| 2019/0244680 A1* | 8/2019 | Rolfe | G16H 50/20 |
| 2019/0327501 A1* | 10/2019 | Walters | G06N 3/084 |
| 2019/0332900 A1* | 10/2019 | Sjolund | G06T 9/001 |
| 2019/0340497 A1* | 11/2019 | Baraniuk | H03M 7/3062 |
| 2019/0347523 A1* | 11/2019 | Rothberg | G06K 9/6259 |
| 2020/0134461 A1* | 4/2020 | Chai | G06N 3/04 |
| 2020/0210812 A1* | 7/2020 | Baker | G06N 3/0481 |
| 2020/0302651 A1* | 9/2020 | Flynn | G06T 9/00 |
| 2021/0004677 A1* | 1/2021 | Menick | G06N 3/08 |

OTHER PUBLICATIONS

Kirillov, Alexander, et al. "Joint training of generic CNN-CRF models with stochastic optimization." Asian Conference on Computer Vision. Springer, Cham, 2016. (Year: 2016).*

Gözcü, Baran, et al., "Learning-Based Compressive MRI," *IEEE Transactions on Medical Imaging*, vol. 37, No. 6, pp. 1394-1406 (Jun. 1, 2018).

Parthasarathy, Nikhil, et al., "Neural Networks for Efficient Bayesian Decoding of Natural Images from Retinal Neurons," *bioRxiv*, 12 pages (May 28, 2018).

Schirrmeister, Robin Tibor, et al., "Deep Learning With Convolutional Neural Networks for EEG Decoding and Visualization," *Human Brain Mapping*, vol. 38, No. 11, pp. 5391-5420 (Aug. 7, 2017).

Xu, Weihong, et al., "Joint Neural Network Equalizer and Decoder," *Lab of Efficient Architecture for Digital Communication and Signal Processing (LEADS)*, 5 pages (Jul. 5, 2018).

Prudyus, Ivan, et al., "Adaptive Aperture Formation Matched With Radiometry Image Spatial Spectrum," *IEEE International Microwave and Radar Conference, Krakow, Poland*, pp. 143-147 (1998).

Baldassarre, Luca, et al., "Learning-Based Compressive Subsampling," *IEEE Journal of Selected Topics in Signal Processing*, vol. 10, No. 4, pp. 809-822 (Jun. 2016).

Prudyus, Ivan, et al., "Robust Image Restoration Matched With Adaptive Aperture Formation in Radar Imaging Systems with Sparse Antenna Arrays," *European Signal Processing Conference EUSIPCO 1998*, pp. 1-4. (Sep. 9, 1998).

Kavukcuoglu, Koray, et al., "Fast Inference in Sparse Coding Algorithms with Applications to Object Recognition," *Computational and Biological Learning Lab, Courant Institute, NYU, Tech Report CBLL-TR-2008-12-01*, 9 pages (Dec. 4, 2008).

Goodfellow, Ian, et al., "Deep Learning," *The MIT Press, Cambridge, MA* (2016).

Foucart, Simon, et al., "A Mathematical Introduction to Compressive Sensing," *Birkhäuser Basel*, vol. 1, No. 3 (2013).

Kingma, Diederik P., et al., "ADAM: A Method for Stochastic Optimization," *CoRR*, 15 pages (2014).

Danielyan, Aram, et al., "BM3D Frames and Variational Image Deblurring," *IEEE Transactions on Image Processing*, vol. 21, No. 4, pp. 1715-1728 (Apr. 2012).

Gregor, Karol, et al., "Learning Fast Approximations of Sparse Coding," *Proceedings of the 27th International Conference on Machine Learning (ICML 2010)*, pp. 399-406 (2010).

Boyd, Stephen, et al., "Distributed Optimization and Statistical Learning via the Alternating Direction Method of Multipliers," *Foundations and Trends in Machine Learning*, vol. 3, No. 1, pp. 1-122 (2011).

Ulyanov, Dmitry, et al., "Deep Image Prior," *arXiv*, preprint arXiv:1711.10925, 10 pages (2017).

Aharon, Michal, et al., "K-SVD: An Algorithm for Designing Overcomplete Dictionaries for Sparse Representation," *IEEE Transactions on Signal Processing*, vol. 54, No. 11, pp. 4311-4322 (Nov. 2006).

Ravishankar, Saiprasad, et al., "Learning Sparsifying Transforms," *IEEE Transactions on Signal Processing*, vol. 61, No. 5, pp. 1072-1086 (Mar. 2013).

* cited by examiner

SIGNAL SAMPLING WITH JOINT TRAINING OF LEARNABLE PRIORS FOR SAMPLING OPERATOR AND DECODER

RELATED APPLICATION

The present application claims priority to European Patent Application No. 18191494.6, filed Aug. 29, 2018, the disclosure of which is hereby incorporated by reference herein in its entirety.

FIELD OF THE INVENTION

The present invention pertains to a method of sampling of signals based on specially learned sampling operators and decoders as well as to a device implementing such a sampling method, both the method and the device being adapted to be used for reconstruction of a signal of interest from a sampled signal and/or for decision making based on the sampled signal.

BACKGROUND OF THE INVENTION AND STATE OF THE ART

In general, the present invention concerns the problem of recovery of a signal of interest x based on an observation signal y, which can be seen as a reconstruction problem. Besides, there are several other problems related to this context that might include the classification, recognition, identification or authentication of said signal of interest x based on the observation signal y. In the following, these latter problems will be referred to as classification problems.

In this context, it is known in the prior art to use data acquisition systems that are based on signal sampling in some transform domain $\Psi \in \mathbb{C}^{N \times N}$ according to a model that can be described by equation $$y = Q(P_\Omega \Psi x + z), \quad (1)$$

where $y \in \mathbb{C}^n$ denotes the observation signal, $x \in \mathbb{C}^N$ or $x \in \mathbb{R}^N$ denotes the signal of interest, $z \in \mathbb{C}^n$ denotes the observation noise and n and N denote the dimensionalities of observed and original signals, respectively. The sets $\mathbb{C}$ and $\mathbb{R}$ denote sets of complex and real numbers, respectively. $P_\Omega: \mathbb{C}^N \to \mathbb{C}^n$ denotes a sampling operator and $Q: \mathbb{C}^n \to \mathbb{Q}^n$ denotes quantizing operator, where $\mathbb{Q}$ represents a set of quantized signals. It is often assumed that $\Psi$ Norms an orthogonal basis that might represent Fourier, Discrete Cosine, Hadamard, wavelet, etc. matrices. However, in certain cases, the basis vectors of the transform $\Psi$ might be non-orthogonal. Therefore, the following will proceed with a consideration of the general case of a non-orthogonal basis.

The domains of application of such sampling methods, on the one hand, relate to image reconstruction and cover, but are not limited to, medical imaging such as magnetic resonance imaging (MM), computerized tomography (CT) and ultrasound, non-destructive testing, remote and astronomy observations based on sparse antennas and antenna arrays, radar imaging, as well as CMOS and CCD sensor-based imaging including colour imaging based on mosaicking principles, Fourier optics, or the like. On the other hand, the domains of application also include security applications like, for example, recognition, identification or authentication of objects and/or of persons. In many applications, the selection of the basis is fixed by the nature of measurements. However, the sampling operator $P_\Omega: \mathbb{C}^N \to \mathbb{C}^n$ can be chosen and optimized such as to take into account some technical constraints. Additionally, the measured signal optionally might be quantized by using the above mentioned quantizing operator $Q: \mathbb{C}^n \to \mathbb{Q}^n$.

In most cases, on the one hand, the sampling of a band-limited signal x should follow the Shannon-Nyquist principles to ensure preservation of the information and uniqueness of the reconstruction. However, if x possesses some structure or sparsity, the signal of interest x can be reconstructed from the observation signal y even when n<N using special decoding algorithms. On the other hand, the above mentioned classification problems need sufficient statistics for the classifier, but do not require complete signal reconstruction. Instead, one is interested in such a sampling to ensure the reliable classification or distinguishability of different classes of signals. Since the above mentioned reconstruction problem is more strict in terms of requirements, the following will proceed with its consideration and will indicate the particularities of said classification problems only when needed.

In the most popular case, the sampling with a random matrice A, which replaces the operators $P_\Omega \Psi$ in equation (1), is implemented by a compressive sampling as considered by S. Foucart and H. Rauhut in the article "A mathematical introduction to compressive sensing", Birkhauser Basel, 2013, vol. 1, no. 3. However, technological advances, in particular in terms of computational complexity and memory storage of currently available hardware, motivate to use the sampling in the form of equation (1), which can be considered as a structured counterpart of compressive sampling. At the same time, the well developed field of compressive sampling suggests the necessary amount of observation for sampling test signals with special sparsity properties under properly generated matrices A. In the general case, it is assumed that the signal of interest x is sparse with some sparsity S or can be sparsely presented in some transform domain.

From a practical perspective, it is extremely attractive to acquire signals with the smallest possible number of samples. Practically, this means that the sampling operator should be adapted to the data, which can be achieved on-fly using some generic information about the properties of the signals in the transform domain $\Psi$ or by using special training or learning procedures.

The optimal on-fly construction of a sampling operator with an iterative reconstruction was considered in the past, amongst others, by I. Prudyus et al. in the article "Robust image restoration matched with adaptive aperture formation in radar imaging systems with sparse antenna arrays" published in European Signal Processing Conference EUSIPCO 1998, 9 Sep. 1998, pp. 1-4 and in the article "Adaptive aperture formation matched with radiometry image spatial spectrum" by I. Prudyus et al., published in IEEE International Microwave and Radar Conference, Krakow, Poland, 1998. In these disclosures, no training on external training datasets was assumed whereas the process of adaption of the sampling operator was based on the fact that many natural images have dominating energy frequency components located along some spatial frequency directions. A small number of samples S in the sampling operator $P_\Omega$ was used to estimate these directions, mainly in the low frequency part of the spectrum, and the remaining budget of sampling components was adapted accordingly to sample along the dominating directions that have most of the energy and information. In this case, the sampling operator was adapted to the properties of each image. One can consider this approach as an analogue of the so-called S-best selection with the given number of sampling components to be S.

The learning approach was considered in the past, amongst others, by L. Baldassarre et al. in the article "Learning-based compressive subsampling," IEEE Journal of Selected Topics in Signal Processing, vol. 10, no. 4, pp. 809-822, 2016, and by V. Cevher et al. in the article "Learning-based subsampling" as well as in US 2017/0109650, filed on Oct. 19, 2015. These disclosures extend the classical formulation of compressive sensing using the sub-sampling structured matrices of the form of equation (1) with an orthonormal operator $\Psi$ and a sampling operator $P_\Omega$. The main idea behind the proposed extension consists in learning of the sampling operator $P_\Omega$ on a training set of images to minimize the average reconstruction error as a cost function. It should be pointed out that due to physical imaging constraints there is no freedom in the selection of the operator $\Psi$, such that the only possible adaptation to data is via the operator $P_\Omega$. The solution to the above adaptation problem thus leads to the natural conclusion that the highest sampling rate of the operator $P_\Omega$ should be concentrated in the region of largest magnitude Fourier transform components similar to the conclusion set out in the above mentioned article "Robust image restoration matched with adaptive aperture formation in radar imaging systems with sparse antenna arrays" by I. Prudyus et al. In turn, the authors suggest that the optimal sampling geometry, i.e. the operator $P_\Omega$, computed on average for a set of natural imaging should be in the region of low frequencies possessing the highest magnitude Fourier transform components, i.e. the highest information content. The difference between the proposals of I. Prudyus et al. set out in the above mentioned article "Robust image restoration matched with adaptive aperture formation in radar imaging systems with sparse antenna arrays" and of V. Cevher et al. set out in the above mentioned article "Learning-based subsampling" as well as in US 2017/0109650 therefore mainly consists in the fact that the sampling operator of the former method is adapted on-fly for each image by use of the S-best selection, whereas the latter method obtains an adapted sampling operator on average by use of a training set. Additionally, in contrast to compressive sensing based on non-linear reconstruction algorithms, V. Cevher et al. in said article "Learning-based subsampling" as well as in US 2017/0109650 consider a linear decoder of form $\hat{x}=\Psi^* P_\Omega^T y$, where * denotes the complex conjugate, and also mention the possibility of using non-linear decoders like basis pursuit (BS) allowing representation of the signal of interest x in a sparse form like $u=\phi x$, where $\phi$ is a sparsifying operator, mainly orthonormal, allowing reverse reconstruction as $\hat{x}=\phi^* u$.

It should be pointed out here that the problem of optimal training of the sampling operator $P_\Omega$ is generally solved as an optimization problem according to equation $$\hat{\Omega}=\mathrm{argmin}_{\Omega:|\Omega|\leq s} \tfrac{1}{2}\Sigma_{i=1}^M \|x_i-\hat{x}_{\Omega i}\|_2^2, \qquad (2)$$

where $\hat{x}_{\Omega i}$ denotes the ith reconstructed sample for i=1, . . . , M from a training set $\{x_i\}_{i=1}^M$ for a particular sampling operator $\Omega$. V. Cevher et al. in said article "Learning-based subsampling" as well as in US 2017/0109650 also mention that other cost functions can be used besides the $l_2$-metric demonstrated in these disclosures. The same authors also consider average- and worst-case strategies.

Although the above mentioned learned structured sampling operators have some obvious advantages over previously used random sampling strategies, these procedures inherently comprise several problems. First, the training set $\{x_i\}_{i=1}^M$ is solely used to train the sampling operator $P_\Omega$, whereas the corresponding linear or non-linear decoders are "hand-crafted" in nature and, therefore, are not adapted to the data of interest. Second, the manner of obtaining an adapted sampling operator in these above mentioned prior art approaches has also a serious impact on both the optimal sampling strategy in the operator $P_\Omega$ and the decoding algorithm. For example, it is worth mentioning that said article "Learning-based subsampling" as well as US 2017/0109650 conclude, on the basis of the sampling operators proposed therein, that one should target to sample only largest magnitude components in the transform domain to ensure the optimal reconstruction of test signals, whilst this is questionable in case different operators were used. In particular, modification of the structure of the decoder might lead to different and potentially more optimal sampling principles.

The solutions according to prior art therefore present several inconveniences related to the manner of obtaining an adapted sampling operator as well as to the hand-crafted nature of corresponding decoding algorithms.

Moreover, all of the prior art documents "Robust image restoration matched with adaptive aperture formation in radar imaging systems with sparse antenna arrays" by I. Prudyus et al., "Learning-based compressive subsampling" by L. Baldassarre et al., and "Learning-based subsampling" as well as US 2017/0109650 by V. Cevher et al. only consider signal sampling for the above mentioned reconstruction problem, but do not address signal sampling for the above mentioned classification problems.

In this context, one might finally add that a number of specific techniques used at different stages in signal modeling and training are known in prior art. For example, the technical report "Fast inference in sparse coding algorithms with applications to object recognition" by K. Kavukcuoglu et al., Computational and Biological Learning Lab, Courant Institute, NYU, Tech Report CBLL-TR-2008-12-01, discloses a model training method known as predictive sparse decomposition. The book "Deep Learning" by I. Goodfellow, et. al., The MIT Press, 2016 also, at least partially, concerns this topic. Furthermore, concerning model training, it is known in prior art to use the so-called ADMM and ADAM techniques which are a sort of standard minimizers or optimizers. For example, the ADMM technique is disclosed by S. Boyd et. al. in the article "Distributed optimization and statistical learning via the alternating direction method of multipliers", Foundations and Trends in Machine Learning, 3(1), pp. 1-122, 2011, and the ADAM technique is disclosed by D. Kingma and J. Ba in the article "ADAM: A method of stochastic optimization", CoRR, 2014. Prior art also discloses techniques like the encoder-decoder training via the Nash equilibrium which is, for example, discussed by A. Danielyan et. al. in the article "Bm3d frames and variational image deblurring," IEEE Transactions on Image Processing, vol. 21, no. 4, pp. 1715-1728, April 2012. Furthermore, K. Gregor and Y. LeCun disclose in the article "Learning fast approximations of sparse coding" published in Proceedings of the 27th International Conference on Machine Learning (ICML 2010) by J. Fürnkranz and T. Joachims (Eds.), pp. 399-406, 2010, the so-called LISTA implementation. In general, techniques of deep learning such as suggested by D. Ulyanov et al. in the article "Deep image prior", arXiv, preprint arXiv:1711.10925, 2017, are of course also known in prior art. However, these disclosures mostly only present specific techniques or mathematic models which are adapted to be used, in isolated manner, at a particular stage in the context of signal processing or classification, but do not form itself a signal sampling method that would allow to overcome the above mentioned problems.

OBJECTIVES OF THE INVENTION

In view of the above presentation of prior art approaches, it is an object of the present invention to overcome the above mentioned difficulties and to realize a method of signal sampling which efficiently uses training signals in an optimal manner for creating and adapting sampling operators to reconstruct images depending on the type of image and/or application, i.e. in the context of the above mentioned reconstruction problem. Within the same context, it is a further object of the present invention to avoid use of decoders that are essentially "hand-crafted" in nature and to provide improved decoders to be used in combination with the adapted sampling operators of the present invention. Moreover, it is an object of the present invention to exploit training signals to its full power. It is another object of the present invention to also address signal sampling for the above mentioned classification problems.

SUMMARY OF THE INVENTION

To this effect, the present invention proposes a method of signal sampling with learnable priors which is characterized by the features enumerated in claim 1 and which allows to achieve the objectives identified above.

In particular, the method according to the present invention distinguishes by the fact that the method comprises, at the training stage, the step of
training the decoder $g_{\theta_g}(.)$ jointly with the sampling operator $P_\Omega$ on a set of training signals $\{x_i\}_{i=1}^{M}$, to obtain a learned decoder $g_{\hat{\theta}_g}$, by
jointly determining, during a cost minimization step of the training stage, a set of sampling parameters $\Omega$ and a set of decoding parameters $\theta_g$ according to a cost function, and by the fact that, at the sampling stage, the step of applying the decoder $g_{\theta_g}(.)$ uses said set of decoding parameters $\theta_g$, such that the estimate $\hat{x}$ of the signal of interest x is produced by the learned decoder $g_{\hat{\theta}_g}$.

According to this first aspect of the present invention, a joint training of the sampling operator and of the decoder is realized, in contrast to prior art sampling methods. This allows to avoid use of "hand-crafted" decoders, to provide improved decoders most adapted to the corresponding sampling operators, as well as to exploit training signals to its full power. In particular, the training data $\{x_i\}_{i=1}^{M}$ isn't solely used for training the sampling operator $P_\Omega$ as it is done in the above cited prior art disclosures which keep the decoder $g_{\theta_g}(.)$ "hand-crafted" and generally data-independent, but is used for a joint training of the sampling operator $P_\Omega$ and of the decoder $g_{\theta_g}(.)$. Additionally, the sampling paradigm that emerges from this approach allows to combine the best from the two worlds of optimal sampling and data compression that seems to be extremely important in the era of Big Data when both the dimensionality and volume of data are greatly increasing.

Moreover, an embodiment of the method distinguishes by the fact that the cost function used in the cost minimization step for determining the set of sampling—$\Omega$ and decoding parameters $\theta_g$ during the joint training of the sampling operator $P_\Omega$ and of the decoder $g_{\theta_g}(.)$ is chosen depending on the targeted application. The latter may, for example, consist in reconstruction, classification, recognition, identification and/or authentication.

According to this second aspect of the present invention, the proposed method allows to make a decision about a class of the signal of interest in recognition and identification applications. In fact, in many applications it is important to produce not only an estimate $\hat{x}_\Omega$ of the signal of interest x by the decoder $g_{\theta_g}(.)$. To the contrary, many security applications require to distinguish a genuine test signal representing some object from a fake one in order to establish its authenticity, to search for similar signals in big data sets, etc. Without loss of generality, the decoder $g_{\theta_g}(.)$ according to the present invention will produce in all these cases a corresponding decision in a form described by equation $$\hat{m} = g_{\theta_g}(y), \quad (3)$$

where $m \in \{1, \ldots, C\}$ with C being the number of classes that can be also encoded into some class label $l(m) \in \Lambda^d$, with d denoting the dimensionality of the label, whereas the sampling operator $P_\Omega$ is optimized to ensure the best performance according to the chosen performance criteria such as, for example, minimization of overall error probability $P_{e_\Omega}$ of the decoder $g_{\theta_g}(.)$ over a set of possible particular sampling parameters $\Omega$. The probability of error $P_{e_\Omega}$ might reflect the classification error composed of a weighted sum of probability of miss and probability of false acceptance or one of these errors with the bounded other one. It is also important to mention that the optimal set of sampling parameters $\Omega$ for the reconstruction, recognition, detection or forensic authentication might significantly differ depending on the chosen cost function, i.e. reconstruction vs. classification, as well as depending on a particular metric and also on training data.

Furthermore, another embodiment of the method distinguishes by the fact that the cost minimization step for determining the set of sampling—$\Omega$ and decoding parameters $\theta_g$ during the joint training of the sampling operator $P_\Omega$ and of the decoder $g_{\theta_g}(.)$ is implemented by an optimization procedure iterated in alternative directions until convergence, the optimization procedure using in a particularly preferred embodiment signal regularization priors $\Omega_x(x)$ and regularization parameter $\lambda_x$.

According to this third aspect of the present invention, the training procedure of the sampling operator $P_\Omega$ may be improved by taking into account in more precise manner as compared to prior art the predetermined properties of specific types of signals, for example of the kind of images, to be sampled and reconstructed, respectively classified.

The present invention also concerns computer program means stored in a computer readable medium adapted to implement this method as well as a corresponding device for signal sampling carrying out the above proposed methods.

Other features and advantages of the present invention are mentioned in the dependent claims as well as in the description disclosing in the following, with reference to the figures, the invention in more detail.

BRIEF DESCRIPTION OF THE DRAWINGS

The attached drawings exemplarily and schematically illustrate the principles as well as several embodiments of the present invention.

DETAILED DESCRIPTION OF THE INVENTION

In the following, the invention shall be described in detail with reference to the above mentioned figures.

The present invention relates to a method of sampling of signals based on especially learned sampling operators and decoders as well as to a device implementing such a sampling method. As already mentioned before, the following description, in general, will concentrate on the consideration of the method according to the present invention when used for the above mentioned reconstruction problem, i.e. for image reconstruction and decoding, and will only highlight, respectively exemplify, differences of the method when used for the above mentioned classification problems in the course of the description. Furthermore, as usual in the domain of signal, image and video processing, the term "signal" is considered throughout the description to cover both analog and digital data in one or more dimensions.

According to the present invention, the sampling operator is trained in such a way to ensure the most accurate and discriminative estimation of signal model parameters that in turn lead to accurate and efficient decoding for the reconstruction or classification. Accordingly, the method according to the present invention comprises two stages: A first stage includes joint learning of a sampling operator $P_\Omega$ and of a generalized decoder $g_{\theta_g}(.)$, which has a set of parameters $\theta_g$, the first stage being referred to as learning or training stage. A second stage includes testing comprising reconstruction of a signal of interest x from an observed signal y and/or other tasks such as detection, classification, recognition, identification and/or authentication using the previously learned, i.e. trained, sampling operator $P_{\hat\Omega}$ and decoder $g_{\hat\theta_g}$, the second stage being referred to as sampling or testing stage. In the context of identification and authentication, as part of a general recognition problem, the training stage is also called enrolment and the testing stage is referred to as verification stage.

Figure 1:
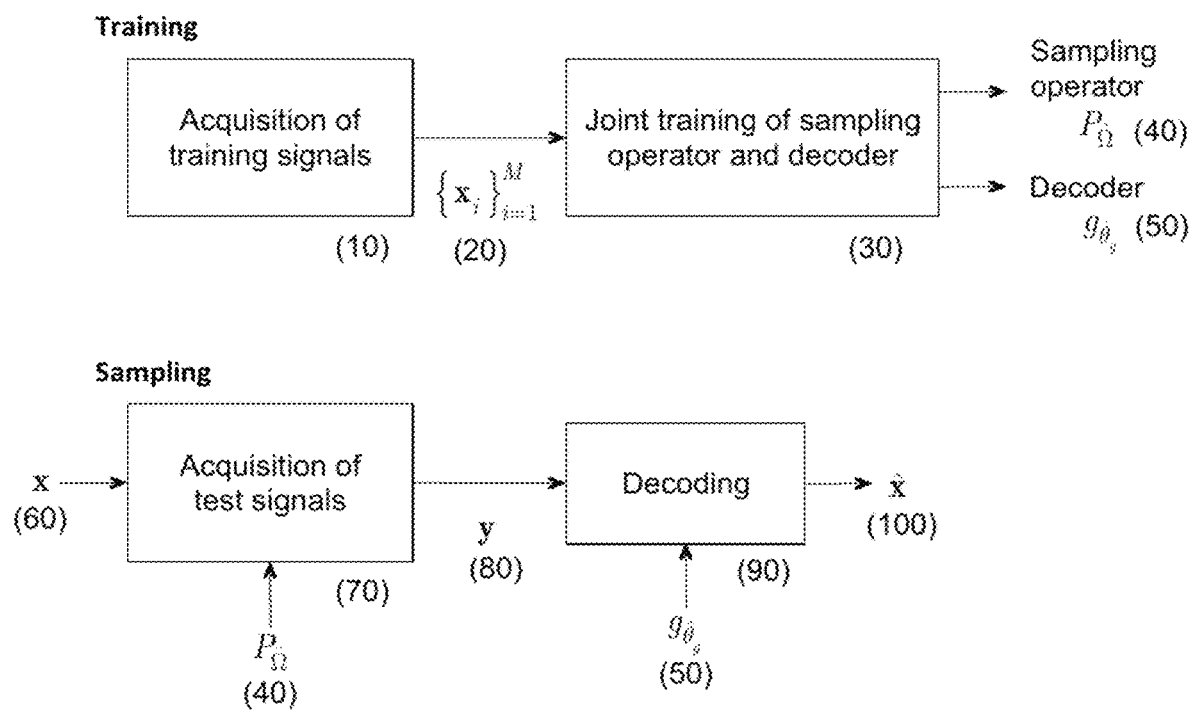
FIG. 1 presents a generic architecture of training and sampling where the sampling operator and the decoder are jointly trained on training signals and then applied to a test signal.

FIG. 1 illustrates the principle of these two stages for the general case of application of the method to the above mentioned reconstruction problem. By use of a set of training signals $\{x_i\}_{i=1}^{M}$ (20) acquired during an acquisition step (10), a joint training of a sampling operator $P_\Omega$ and of a decoder $g_{\theta_g}(.)$ is performed in training stage (30), resulting into a particular set of sampling parameters $\hat\Omega$ used for the learned sampling operator $P_{\hat\Omega}$ (40) and a particular set of decoding parameters $\hat\theta_g$ used for the learned decoder $g_{\hat\theta_g}$ (50). The sampling of unknown signal of interest x (60) is performed in sampling stage (70) using the given, learned sampling operator $P_{\hat\Omega}$ (40) resulting into the observation signal y (80). The following decoding step (90) is based on the given, learned decoder $g_{\hat\theta_g}$ and results into an estimate $\hat x$ (100) of the signal of interest. For reasons of completeness, it shall be noted in this context that, in general, it is possible, depending on the specific application of the method according to the present invention, that the transform domain is chosen to be an identity operator $\Psi=I$, such that the joint training of the sampling operator $P_\Omega$ and of the decoder $g_{\theta_g}(.)$ is performed in the spatial domain instead of in some transform spectral domain.

Figure 2:
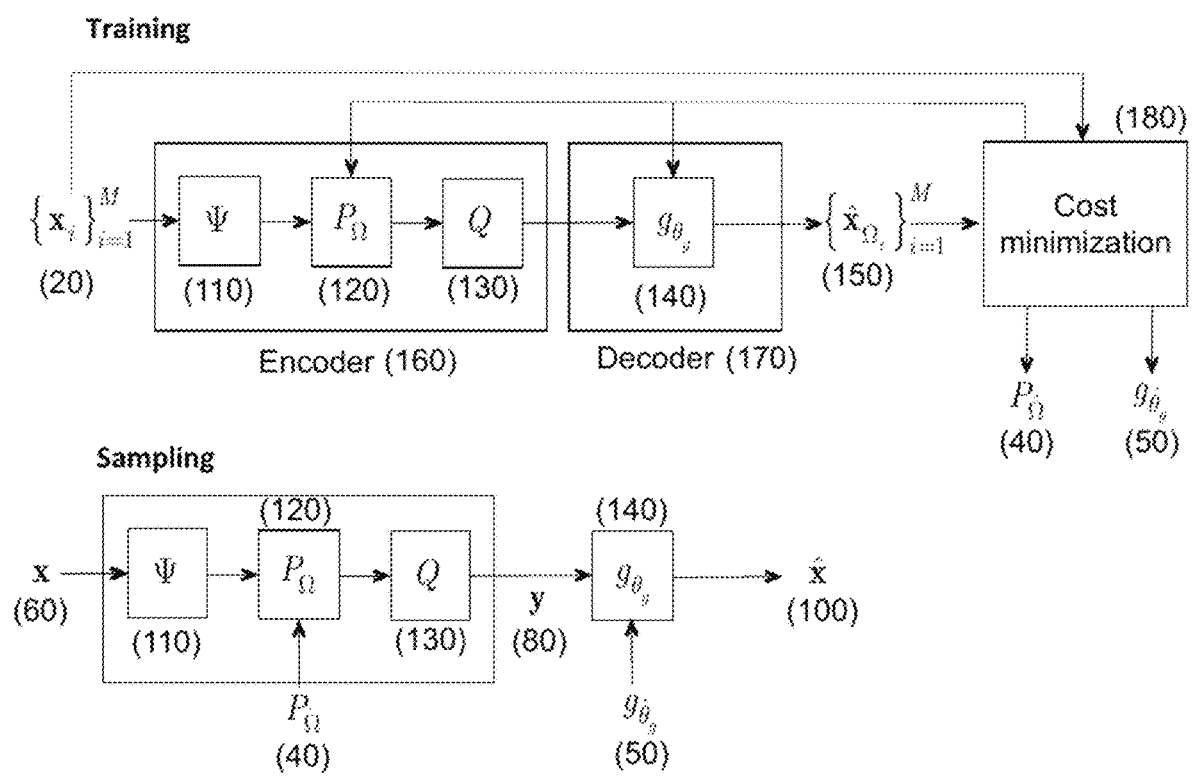
FIG. 2 further explains the method of training and sampling of FIG. 1 by showing the details of the main elements of the sampling and decoding pipelines combined with a minimization of a chosen cost function.

More specifically, the training procedure generally illustrated in FIG. 1 is based on the training pipeline shown in more detail in FIG. 2. The set of training signals $\{x_i\}_{i=1}^{M}$ is observed via a sequence of transformations using a transform domain $\Psi$ (110), the sampling operator $P_\Omega$ (120) and an optional quantization $Q(.)$ (130), producing a set of observable signals $\{y_i\}_{i=1}^{M}$ that might be additionally corrupted by noise. These operations are combined into a block by an observation encoder (160). A parametrized observation decoder (170) includes the decoder $g_{\theta_g}$ (140) that produces estimates $\{\hat x_{\Omega i}\}_{i=1}^{M}$ (150) of the set of training signals $\{x_i\}_{i=1}^{M}$ based on the set of observable signals $\{y_i\}_{i=1}^{M}$. The training is performed, during cost minimization step (180), by minimizing a cost function leading to the best possible reconstruction of the estimates $\{\hat x_{\Omega i}\}_{i=1}^{M}$ closest to $\{x_i\}_{i=1}^{M}$ in some metric or latent space over sets of sampling parameters $\Omega$ and of decoding parameters $\theta_g$. In the simplest case, the Euclidean distance can be used. The results of this optimization are estimates of the learned sampling operator $P_{\hat\Omega}$ (40) and of the learned decoder $g_{\hat\theta_g}$ (50). Analogously, the sampling procedure generally illustrated in FIG. 1 is based on the sampling pipeline shown in more detail in FIG. 2 and combines an observation encoder (160) and decoder (170) with the trained sampling operator $P_{\hat\Omega}$ and decoder $g_{\hat\theta_g}$ used in steps (120) and (140). The result of decoding is an estimate $\hat x$ (100) of the signal of interest x.

The present invention proposes, in particular in the context of the above mentioned reconstruction problem, two approaches for the joint training stage of the sampling operator and of the decoder as well as for the testing/sampling stage schematically shown in FIG. 2. Like will become clear in the following, the two approaches mainly differ at the training stage, whilst the corresponding sampling stages of the two approaches are almost identical. In the following, these approaches will be referred to as inverse problem solution and regression approaches.

According to the inverse problem solution approach to reconstruction, the joint training of the sampling operator and of the decoder comprises two steps. During a first step, the set of sampling parameters $\Omega$ is fixed and one tries to find the estimate $\hat x$ (100) of the signal of interest and the decoding parameters $\theta_g$ by solving an optimization problem using hand-crafted or learned properties of the signal of interest x from the set of training signals $\{x_i\}_{i=1}^{M}$. The optimization is described by equation $$\hat x_\Omega = \operatorname{argmin}_x \tfrac{1}{2}\|y - P_\Omega \Psi x\|_2^2 + \lambda_x \Omega_x(x), \qquad (4)$$

where $\Omega_x(x)$ is a signal regularization prior linked to the properties and priors of the signals to be sampled and reconstructed, $\lambda_x$ is a regularization parameter and $\|.\|_2$ denotes the $l_2$-norm. The regularization prior $\Omega_x(x)$ and the regularization parameter $\lambda_x$ aren't used in prior art methods and allow to take into account in improved manner the predetermined properties of specific types of signals, i.e. of the kind of images, to be sampled and reconstructed by introducing corresponding priors which are learned during the training stage of the method according to the present invention. In fact, to illustrate utility of these regularization priors and parameters in practical manner, it is clear that medical images, e.g. images of human kidney obtained by MRI, have different, but predetermined properties than images obtained by astronomy observations or else images of a given kind of objects obtained by CMOS/CCD cameras like simple facial portraits or the like. The predetermined properties of the corresponding images are reflected in the method according to the present invention in different, previously trained regularization priors $\Omega_x(x)$ and parameters $\lambda_x$ for each type of images.

Different strategies for the design of the signal priors $\Omega_x(x)$ will be considered here below. The resulting estimate $\hat{x}$ (100) of the signal of interest can be expressed by equation $$\hat{x}_\Omega = g_{\hat{\theta}_g}(y, \Omega), \quad (5)$$

where $g_{\hat{\theta}_g}(.)$ is a decoder obtained from equation (1) and $\widehat{\theta_g}$ denotes the particular set of decoding parameters. The set of sampling parameters $\Omega$ is used in the decoder $g_{\hat{\theta}_g}(.)$ as an argument to signify the fact that the decoder depends on the set of sampling parameters $\Omega$.

During a second step, using equation (2) and the set of training signals $\{x_i\}_{i=1}^{M}$ consisting of M training samples, one tries to optimize the set of sampling parameters $\Omega$ according to equation $$\hat{\Omega} = \mathrm{argmin}_\Omega \Sigma_{i=1}^{M} \|x_i - \hat{x}_{\Omega i}\|_2^2 + \lambda_\Omega \Omega_\Omega(\Omega), \quad (6)$$

where $\Omega_\Omega(.)$ is a prior on desirable properties of the set of sampling parameters $\Omega$ combining the geometry, the number of samples, etc.

The optimization procedure iterates the first and second steps till convergence. This procedure is similar to an alternative direction minimization.

After joint training of the sampling operator and of the decoder, the testing/sampling stage of the inverse problem solution approach also has two steps during which the learned sampling operator and decoder are applied to real data, i.e. to a signal, which was not seen before, but which is assumed to follow the same statistics as the training data.

During a first step, by using a given set of particular sampling parameters $\hat{\Omega}$, one tries to produce the observation signal y by use of equation $$y = P_{\hat{\Omega}} \Psi x. \quad (7)$$

During a second step, by using a given observation signal y, the decoder (2) produces an estimate $\hat{x}$ (100) of the signal of interest using equation $$\hat{x} = g_{\hat{\theta}}(y, \hat{\Omega}). \quad (8)$$

According to the regression approach to the reconstruction problem, the joint training of the sampling operator and of the decoder may also be formulated as an optimization problem which, in this case, may be described by equation $$(\hat{\Omega}, \hat{\theta}_g) = \mathrm{argmin}_{\Omega, \theta_g} \sum_{p=1}^{P} \sum_{i=1}^{M} \frac{1}{2} \|x_i - g_{\theta_g}(P_\Omega \Psi(x_i + z_p))\|_2^2 + \gamma_1 \Omega_\Omega(\Omega) + \gamma_2 \Omega_{\theta_g}(\theta_g), \quad (9)$$

where the decoder is assumed to be factorized as a deep structure of a form described by equation $g_{\theta_g}(x) = \sigma_D^g (W_D^g \ldots \sigma_1^g(W_1^g(x)))$, with $\theta_g = (W_1^g \ldots, W_D^g)$ being parameters of a deep network, whilst $\sigma_k^g(.)$ stands for point-wise non-linearities $k=1, \ldots, D$ with D denoting the number of layers; $\Omega_\Omega(\Omega)$ denotes the constraints on the geometry and properties of the sampling operator and $\Omega_{\theta_g}(\theta_g)$ defines constraints on decoder parameters; $\gamma_1$ and $\gamma_2$ are regularization parameters. Equation (9) also includes a factor for additional robustification to possible noise perturbations via additive component $z_p$, $p=1, \ldots, P$ following some predefined distribution, where P denotes the number of noisy training examples.

Since the simultaneous minimization is not feasible due to the non-convexity in both $\Omega$ and $\theta_g$, one can proceed by reformulating the problem as an iterative alternative minimization, keeping one of the parameters fixed and optimizing the second one, whilst preferably skipping the noise component for simplicity. Such manner of proceeding also has two steps.

During a first step, the set of sampling parameters $\Omega$ is kept fixed and one tries to find the decoding parameters according to equation $$\hat{\theta}_g = \mathrm{argmin}_{\theta_g} \sum_{i=1}^{M} \frac{1}{2} \|x_i - g_{\theta_g}(P_\Omega \Psi(x_i))\|_2^2 + \gamma_1 \Omega_{\theta_g}(\theta_g). \quad (10)$$

During a second step, the decoding parameters $\hat{\theta}_g$ are kept fixed and one tries to optimize the set of sampling parameters $\Omega$ according to equation $$\hat{\Omega} = \mathrm{argmin}_\Omega \sum_{i=1}^{M} \frac{1}{2} \|x_i - \hat{x}_{\Omega i}\|_2^2 + \lambda_1 \Omega_\Omega(\Omega), \quad (11)$$

similarly to equation (6) in the inverse problem solution approach. The optimization procedure iterates the first and second steps till convergence.

The testing/sampling stage of the regression approach is identical to the one of the inverse problem solution approach and is based on above mentioned equations (7) and (8), however with the difference in the structure of the decoder $g_{\theta_g}$ which is represented in the regression approach in a form of a deep network, such as indicated in equation (9).

For reasons of completeness and of clarity, it is added here that the nomenclature "inverse problem solution approach" and "regression approach" pertains to the fact that, on the one hand, in the first named approach the decoder $g_{\hat{\theta}_g}(.)$ is only implicitly constructed as a solution of equation (4), whilst in the second named approach the decoder $g_{\hat{\theta}_g}(.)$ is explicitly constructed in equation (9). On the other hand, in the first named approach equation (4) represents a typical signal processing or physics based solution of an inverse problem, this explaining the choice of name for this approach, whilst in the second named approach equation (9) represents a direct joint optimization formulation for both of the sampling operator and of the decoder, also called regression formulation, this being a typical machine learning formulation.

Construction of Priors Ω(x) for the Inverse Problem Solution Approach

The presence of reliable priors $\Omega(x)$ plays a crucial role for the above mentioned reconstruction problem, in particular within the above described inverse problem solution approach, which is mainly due to the, in principle, ill-posed nature of equation (4).

Figure 5:
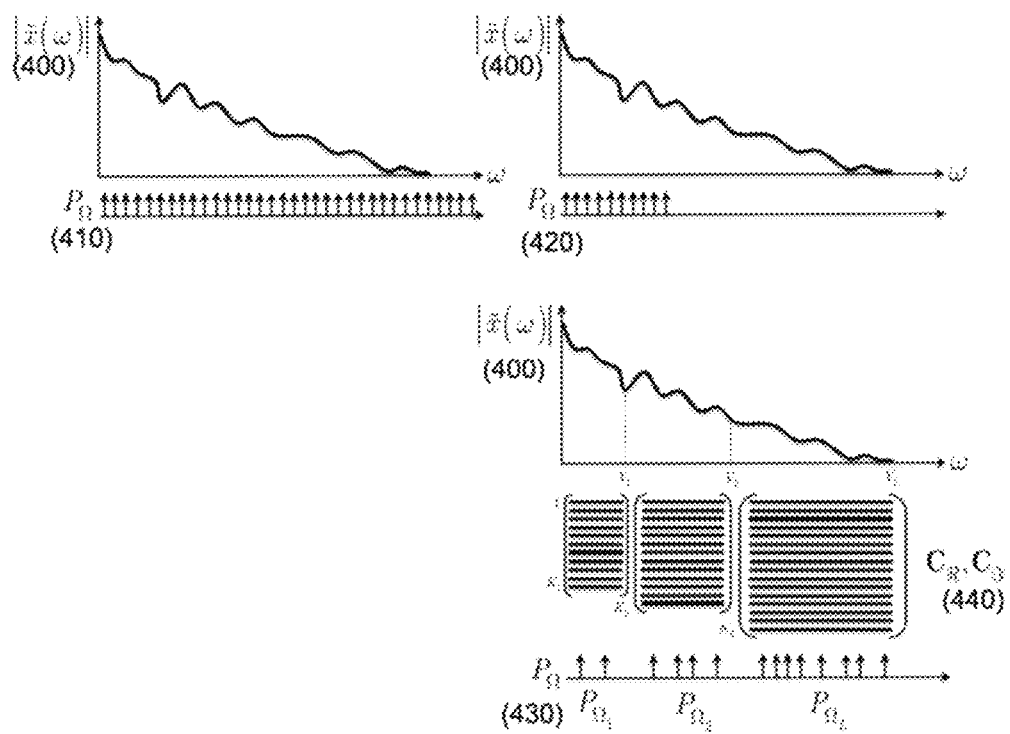
FIG. 5 schematically illustrates the difference between signal sampling according to the present invention as compared to two prior art approaches to signal sampling.

In general, one can distinguish three cases as far as is concerned the construction of a model for the regularization priors $\Omega(x)$ in equation (4), namely a first case where no priors are used, a second case using hand-crafted priors, both of which belong to prior art, and a third case using learnable priors and corresponding to a particularly preferred embodiment of the sampling method according to the present invention. FIG. 5 schematically illustrates the difference between the preferred learning of priors within the signal sampling method according to the present invention as compared to said two prior art approaches to signal sampling. Like symbolically indicated in the left upper part of FIG. 5, the first prior art approach to signal sampling is based on a standard sampling requiring acquisition of all signal samples under the absence of any prior information about the nature of acquired signals. Like symbolically indicated in the right upper part of FIG. 5, the second prior art approach to signal sampling is based on a sampling operator adapted to some fixed linear decoder and chosen metric of reconstruction, thus leading to sampling of the largest magnitude coefficients that are concentrated for natural images in the region of low frequencies. Like symbolically indicated in the lower part of FIG. 5 and though the above mentioned two prior art approaches may in principle also be used within the joint training stage of the method according to the present invention, the method of signal sampling according to the present invention preferably uses learnable encoder and decoder priors.

To describe these differences in more detail, it is to be noted that the first case corresponds to the method disclosed in the above mentioned article "Learning-based subsampling" and US 2017/0109650 by V. Cevher et al., such method completely disregarding the above mentioned signal regularization priors, but in fact only solving a least squares problem described by equation $$\hat{x} = \mathrm{argmin}_x \tfrac{1}{2} \| y - P_\Omega \Psi x \|_2^2, \tag{12}$$

leading to a so-called linear decoder described by equation $$x = \Psi^* P_\Omega^T y, \tag{13}$$

that can also be considered as a particular case of equation (4) for $\lambda_x = 0$.

The second case is based on hand-crafted priors assuming that the signal of interest x might be sparsely presented in some orthogonal basis $\phi$ like Fourier, DCT, wavelet, Hadamard, etc. One can distinguish two models here.

In a first model using a so-called synthesis or sparse approximation model, one can present the signal of interest x by equation $$x = \phi u + e_x, \tag{14}$$

where $e_x$ is a residual error of approximation and u is assumed to be sparse, leading to $l_1$- or $l_0$-"norm" regularizers. The corresponding regularizer can be described by equation $$\lambda \Omega_x(x) = \frac{\gamma}{2} \| x - \phi u \|_2^2 + \alpha_u \Omega_u(u), \tag{15}$$

where $\Omega_u(u)$ is a regularizer which imposes a sparsity on (u) as well as $\gamma$ and $\alpha_u$ are regularization coefficients. This is described for example by M. Aharon et al. in the article "K-SVD: An algorithm for designing overcomplete dictionaries for sparse representation", IEEE Transactions on signal processing, 54, 11, pp. 4311-4322, 2006.

In contrast, a second model known as the analysis model or also known as sparsifying transform, disclosed for example by S. Ravishankar and Y. Bressler in the article "Learning Sparsifying transform", 61, 5-8, pp. 1072-1086, 2013, assumes that $$u = Wx + e_u, \tag{16}$$

where W is the analysis transform that for the orthonormal case is just $W = \Phi^T$ and $e_u$ represents the noise of approximation. The corresponding regularizer can be described by equation $$\lambda \Omega_x(x) = \frac{\gamma}{2} \| Wx - u \|_2^2 + \alpha_u \Omega_u(u). \tag{17}$$

The solution to equation (4) with priors according to equations (15) or (17) is generally obtained by iterative methods.

The third case corresponds to a particularly preferred embodiment of the sampling method according to the present invention and is based on learnable priors that explore the full power of training with the set of training signals $\{x_i\}_{i=1}^M$. In principle, one can reformulate equation (4) jointly with equations (14) and (16) to learn the basis $\phi$ and the analysis transform W as a single overcomplete transform or layer.

Figure 3:
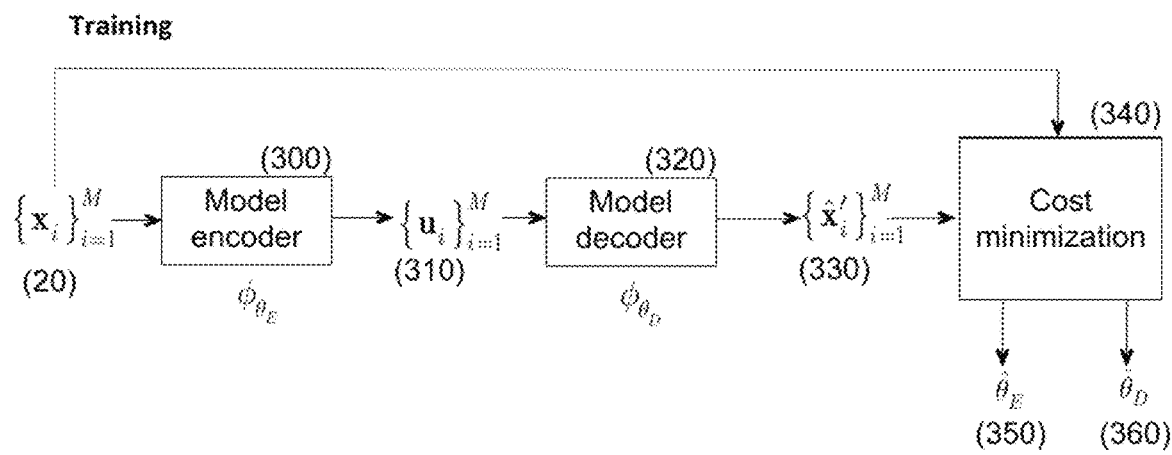
FIG. 3 is a simplified block-diagram illustrating a model training framework based on a set of training signals resulting in the estimation of encoder and decoder model parameters.

However, in view of the complexity of this problem and the benefits offered by deep architectures, the following will consider an alternative model. Given a set of training signals $\{x_i\}_{i=1}^M$, training of a model prior factorized via a model encoder-decoder pair such as shown in FIG. 3 will be considered as a stand-alone step. For the most general case, it will be assumed that the model encoder $\phi_{\theta_E}(.)$ (300) is trained jointly with the model decoder $\phi_{\theta_D}( )$ (320) according to a predefined cost function (340) to estimate the encoder parameters $\hat{\theta}_E$ (350) and the decoder parameters $\hat{\theta}_D$ (360). The parameters of the encoder $\theta_E = (W_1^E, \ldots, W_L^E)$ and the parameters of the decoder $\theta_D = (W_1^D, \ldots, W_L^D)$ define the parametrized encoder $\phi_{\theta_E}(x) = \sigma_L^E(W_L^E \ldots \sigma_1^E(W_1^E x))$ and the parametrized decoder $\phi_{\theta_D}(x) = \sigma_L^D(W_L^D \ldots \sigma_1^D(W_1^D x))$ with D layers, respectively. The latent space variables $\{u_i\}_{i=1}^M$ (310) represent a sort of compressed version of the set of training signals $\{x_i\}_{i=1}^M$ (20). The model training, i.e. estimation of $\hat{\theta}_E$ and $\hat{\theta}_D$, can be performed similarly to the predictive sparse decomposition technique mentioned in the introduction, which leads to equation $$(\hat{\theta}_E, \hat{\theta}_D) = \mathrm{argmin}_{\theta_E, \theta_D} \sum_{i=1}^M \frac{1}{2} \| x_i - \phi_{\theta_D}(u_i) \|_2^2 + \alpha_u \Omega_u(u_i) + \frac{\mu}{2} \| u_i - \phi_{\theta_E}(x_i) \|_2^2 + \lambda_1 \Omega_{\theta_E}(\theta_E) + \lambda_2 \Omega_{\theta_D}(\theta_D), \tag{18}$$

where $\Omega_{\theta_E}$ and $\Omega_{\theta_D}(.)$ are technical constraints on the parameters of the encoder and the decoder, respectively. Assuming $\mu \to \infty$, this results into $u_i = \phi_{\theta E}(x_i)$ and leads to the generation of a broad family of auto-encoders in a form that is, in principle, known in the context of so-called deep learning techniques mentioned in the introduction and that can be described by equation $$(\hat{\theta}_E, \hat{\theta}_D) = \operatorname{argmin}_{\theta_E, \theta_D} \sum_{i=1}^{M} \frac{1}{2}\|x_i - \phi_{\theta_D}(\phi_{\theta_E}(x_i))\|_2^2 + \alpha_u \Omega_u(\phi_{\theta_E}(x_i)) + \lambda_1 \Omega_{\theta_E}(\theta_E) + \lambda_2 \Omega_{\theta_D}(\theta_D). \quad (19)$$

In this context, one can use the ADMM approach mentioned in the introduction and known as such by a person skilled in the art, in combination with efficient optimizers such as ADAM, also mentioned in the introduction and known as such by a person skilled in the art, at each stage.

Alternatively, one can also consider even simpler approaches such as k-means applied to the subbands of the transform domain $\Psi x$ to train the encoder-decoder pair. This alternative will be explored further below for reasons of demonstrating the power of the method according to the present invention, even if used in combination with such a simple model as k-means for determining the learnable priors, over the above described first and second cases wherein no priors, respectively only hand-crafted priors are used and wherein the decoder does not use the learnable priors and only the sampling operator is trained.

Once the encoder-decoder pair $(\hat{\theta}_E, \hat{\theta}_D)$ is trained on the set of training signals $\{x_i\}_{i=1}^{M}$, one can reformulate equation (4) using the parametrized regularization prior $\Omega_x(x)$ into cost functions described by the following equations $$J_1(u,x) = \frac{1}{2}\|y - P_\Omega \Psi x\|_2^2 + \frac{\gamma}{2}\|x - \phi_{\theta_E}(u)\|_2^2, \quad (20)$$

$$J_2(u,x) = \frac{1}{2}\|u - \phi_{\theta_D}(x)\|_2^2 + \alpha_u \Omega_u(u). \quad (21)$$

Applying the Nash equilibrium mentioned in the introduction and known by a person skilled in the art to equations (20) and (21) similarly to leads to a consensus of restrictions imposed by said cost functions hand $J_1$ and $J_2$. Said consensus of restrictions is defined as a fixed point $(u^*, x^*)$ fulfilling equations $$x^* = \operatorname{argmin}_x J_1(u^*, x^*), \quad (22)$$

$$u^* = \operatorname{argmin}_u J_2(u, x^*), \quad (23)$$

this being similar in spirit to the above mentioned ADMM approach.

One can demonstrate that a solution to equations (22) and (23) is obtained, by skipping here the dependence of the estimate of the signal of interest on the set of sampling parameters $\Omega$, as an iterative decoder of a form described by equation $$\hat{x}^k = \beta F y - (I - \beta F P_\Omega \Psi) \tilde{x}^k, \quad (24)$$

with an estimate of the signal of interest $\tilde{x}^k = \varphi(\hat{x}^{k-1}, \alpha_u)$ where $\varphi(.)$ is a non-linear function depending on a set of sampling parameters $\Omega_u(.)$ and a transform domain $F = (\Psi^* P_\Omega^T P_\Omega \Psi)^+ \Psi P_\Omega^T$, with "+" denoting a pseudo-inverse, that can be further reduced for special forms of the transform domain $\Psi$.

Figure 4:
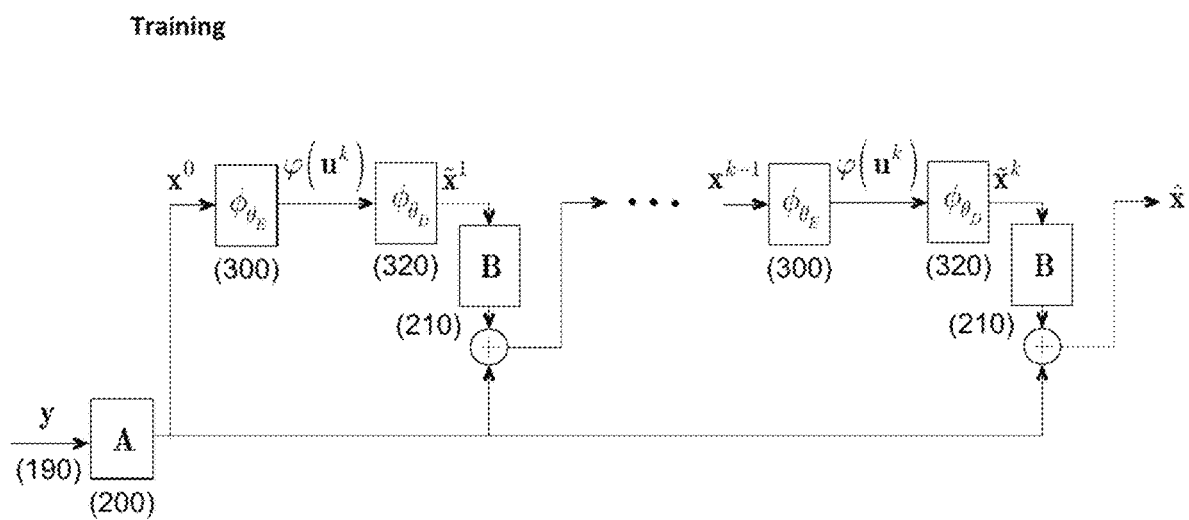
FIG. 4 schematically illustrates an implementation of an iterative decoder in a form of a multi-layer network with fixed blocks of model encoding and decoding as well as common reconstruction blocks A and B chosen to be fixed for illustration purposes.

Moreover, one can also consider, for equation (24), to use the LISTA implementation which is mentioned in the introduction as well as known by a person skilled in the art and which has a form of a deep network such as shown schematically in FIG. 4. The latter schematically illustrates an implementation of an iterative decoder in a form of a multi-layer network with fixed blocks of model encoding and decoding as well as common reconstruction blocks A and B chosen to be fixed for illustration purposes. For the common reconstruction blocks A and B, it is assumed that $A = \beta F$ and $B = I - \beta F P_\Omega \Psi$. In a more general case, the model encoder-decoder blocks as well as blocks B can be updated at each layer according to the minimization of the overall cost function that will increase the quality of reconstruction and minimize the number of layers needed in comparison with the above mentioned example of a fixed block network decoder.

K-Means Based Model Encoder-Decoder with Subbands Partition

In this section, it will be presented how the model training may be implemented in the context of the proposed joint learning of the sampling operator and the decoder by use of a k-means model applied to the subbands of the transform domain $\Psi x$ to train the encoder-decoder pair. The procedure again comprises two stages, namely training/learning and testing/sampling.

The training/learning stage may be described by the following procedure:

1. One assumes some complex transform domain $\Psi$ consisting of $\Psi = (\Psi_{re}, \Psi_{im})$ that leads to a representation described by equation $$\Psi x = \Psi_{re} x + j \Psi_{im} x = x_{re} + j x_{im}, \quad (25)$$

such as Fourier transform.

2. The Fourier spectrum is split into L subbands. The splitting might be overlapping or non-overlapping. The splitting is done such as to ensure that the magnitude of the Fourier transform domain components of each subband $$e(l) = \frac{1}{V_l} \sqrt{\sum_{b=1}^{V_l} |\Psi x_b(l)|^2}, \, l \in (1, \ldots, L)$$

is the same, where $V_l$ is the number of samples in each subband l.

3. Given a set of training signals $X = (x_1, \ldots, x_M)$, the latter is split into L subbands as $(\Psi X) = ((\Psi X_1), \ldots, (\Psi X_L))$.

4. Thereafter, two codebooks for the real $C_{re}$ and imaginary $C_{im}$ parts are generated using the k-means algorithm which is well known to a person skilled in the art. One can generate the codebooks independently or jointly.

5. The sampling operator training following thereafter consists of two parts that lead to minimization of the overall reconstruction error. The first part aims at minimizing the reconstruction error from the direct observation signal y in the set of sampling parameters $\Omega$. It naturally leads to selection of coefficients with the largest magnitudes in the Fourier spectrum $\Psi X$ of the set of training signals. The second part seeks minimizing the error between the set of centroids and the samples in the set of sampling parameters $\Omega$. At the same time, it is important to note that the set of sampling parameters $\Omega$ should be chosen in such a way to ensure the maximum distinguishability of codewords in the codebooks. Otherwise, if the distances to several codewords in the sampling points of the set of sampling parameters Ω are very small, the codewords are not distinguishable and any random perturbation might flip them. The result of this procedure will lead to a set of sampling parameters Ω ensuring the most informative and accurate selection of the codewords in the trained codebooks $C_{re}$ and $C_{im}$. The considered trained representation also closely resembles the compressed representation of data in the trained codebooks.

The testing/sampling stage may be described by the following procedure:

Given an observation signal which may be represented as a vector $y=P_\Omega \Psi x=(P_{\Omega 1}\Psi x, P_{\Omega 2}\Psi x, \ldots, P_{\Omega L}\Psi x)$ as a subband based sampling, the decoder first finds the closest representatives in the codebooks $C_\Re$ and $C_\Im$ for each subband l by use of equation $$c_{re_l}(\hat{j}) = \mathrm{argmin}_{1 \leq j \leq K_l} \|y_{re_l} - P_{\Omega_l} c_{re_l}(j)\|_2^2$$

$$c_{im_l}(\hat{j}) = \mathrm{argmin}_{1 \leq j \leq K_l} \|y_{im_l} - P_{\Omega_l} c_{im_l}(j)\|_2^2, \quad (26)$$

where $K_l$ denotes the number of codewords in each subband $l \in (1, \ldots, L)$.

One can also include the magnitude and phase components to improve the overall system performance, such as described by equation $$(c_{re_l}(\hat{J}), c_{im_l}(\hat{J})) = \mathrm{argmin}_{1 \leq j \leq K_l} \|y_{re_l} - P_{\Omega_l} c_{re_l}(j)\|_2^2 + \qquad (27)$$
$$\|y_{im_l} - P_{\Omega_l} c_{im_l}(j)\|_2^2 + \alpha_1 \||y_l| - |P_\Omega(c_{re_l}(j) + jc_{im_l}(j))|\|_2^2 +$$
$$\alpha_2 \|\mathrm{arg}(y_l) - \mathrm{arg}(P_\Omega(c_{re_l}(j) + jc_{im_l}(j)))\|_{2\pi}$$

where $|.|$ and $\mathrm{arg}(.)$ denote the magnitude and phase of a complex vector, respectively, $\|.\|_{2\pi}$ is a mean angular difference normalized in the range $(0, 2\pi)$, and $\alpha_1$ and $\alpha_2$ are Lagrangian multipliers.

The reconstruction is based on the decoder producing an estimate of the signal of interest according to equation $$\hat{x} = \Psi^* \left\{ \begin{array}{c} (P_{\Omega_1}^T y^1 + P_{\Omega_1^c}^T P_{\Omega_1^c} (c_{re_1}(j) + jc_{im_1}(j))), \\ \ldots \\ (P_{\Omega_L}^T y^L + P_{\Omega_L^c}^T P_{\Omega_L^c} (c_{re_L}(j) + jc_{im_L}(j))), \end{array} \right\} \quad (28)$$

where $\{.\}$ denotes the concatenation of vectors. The main difference of this decoder as compared to the linear decoder disclosed in the article "Learning-based subsampling" and the document US 2017/0109650 consists in the presence, in the decoder according to the present invention, of injected learnable priors coming from the learned K-means codebooks. Another difference between the decoders is the presence, in the decoder according to the present invention, of multiple subbands optimized for optimal sampling.

Choice of the Cost Function

In general, the cost function used in the sampling method according to the present invention at the cost minimization step (180) for determining the set of sampling—Ω and decoding parameters $\theta_g$ during the joint training of the sampling operator $P_\Omega$ (120) and of the decoder $g_{\theta_g}(.)$ (140) is chosen depending on the targeted application. In particular, the cost function may comprise a metric of closeness between two signals of interest x (60) in the direct domain or latent space for recognition of the signal of interest x (60) or may comprise a metric of closeness between the targeted and estimated labels for classification, recognition, authentication, identification or forensic analysis of the signal of interest x (60). Furthermore, the cost function used in the cost minimization step (180) for determining the set of sampling—Ω and decoding parameters $\theta_g$ during the joint training of the sampling operator $P_\Omega$ (120) and of the decoder $g_{\theta_g}(.)$ (140) may optionally contain an additional constraint on the latent space ensuring rate-efficient representation of model parameters for a joint minimization of the sampling rate in the sampling operator $P_\Omega$ and of the compression rate in the model latent space for a desired reconstruction distortion used for joint sampling-compression applications. These features are particularly interesting in applications of the present method related to security, like identification or authentication.

Modified Cost Function for Classification and/or Recognition

For applying the method according to the present invention to the above mentioned classification problems, in particular to classification and/or recognition of the signal of interest x based on the observation signal y, the training stage is formulated as an optimization problem according to equation $$(\hat{\Omega}, \hat{\theta}_g) = \mathrm{argmin}_{\Omega, \theta_g} \sum_{p=1}^{P} \sum_{i=1}^{M} \sum_{m=1}^{C} L(l(m), \qquad (29)$$
$$g_{\theta_g}(P_\Omega \Psi(x_i + z_p))) + \gamma_1 \Omega_\Omega(\Omega) + \gamma_2 \Omega_{\theta_g}(\theta_g),$$

wherein the decoder $g_{\theta_g}(.)$ is a classifier, i.e. $g_{\theta_g}: \mathbb{R}^n \to \{1, \ldots, C\}$ and $l(m)$ is an encoded class label for the class $g_{\theta_g}: \mathbb{R}^n \to \{1, \ldots, C\}$. $L(.)$ denotes a corresponding cost function typically used in classification problems. For reasons of clarity, it is added here that this description refers to the classification problem as a general problem. The classification problem can be split into two problems, namely—if there are only two hypothesis—it is referred to as authentication problem, and—if there are several hypothesis—it is referred to as recognition or identification problem. For the sake of completeness, it shall be noted that the terms «recognition» and «identification» are sometimes used with different signification in research communities. In the present description, identification shall signify a classification problem having M+1 hypothesis, i.e. including a reject option in case the probe does not fit to any of the known classes, whereas recognition shall signify a classification problem having M hypothesis and the probe should be classified as one of the known classes without a reject option.

Modified Cost Function for Authentication

In order to allow for authentication by the method according to the present invention, the training stage is formulated as an optimization problem according to equation $$(\hat{\Omega}, \hat{\theta}_g) = \mathrm{argmin}_{\Omega, \theta_g} \sum_{p=1}^{P} \sum_{i=1}^{M} \sum_{m=0}^{1} L(l(m), \qquad (30)$$
$$g_{\theta_g}(P_\Omega \Psi(x_i + z_p))) + \gamma_1 \Omega_\Omega(\Omega) + \gamma_2 \Omega_{\theta_g}(\theta_g),$$

wherein the decoder $g_{\theta_g}(.)$ is a binary authentication classifier, i.e. $g_{\theta_g}: \mathbb{R}^n \rightarrow \{0,1\}^s$ and l(m) is an encoded class label. L(.) a gain denotes a corresponding cost function.

Figure 6:
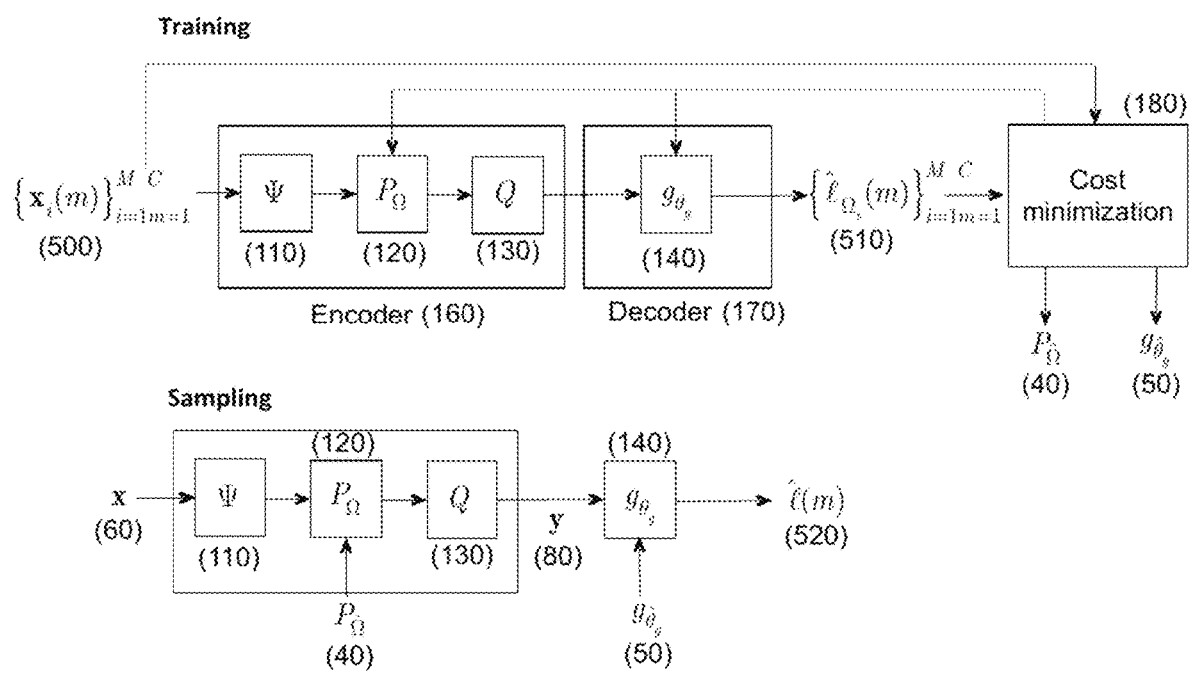
FIG. 6 illustrates a joint training of the sampling operator and the decoder for a generic classification problem.

Both approaches for classification based on the recognition and on the authentication formulations are shown in FIG. 6 which schematically illustrates a joint training of the sampling operator and the decoder for a generic classification problem. The cost function is optimized at the training stage to ensure the desired output of the decoder under the constraint on the sampling operator. In contrast to FIG. 2, where the output of the decoder is an estimate of signal $\hat{x}_\Omega$, the decoder in the classification setup outputs an estimate of class label $\hat{l}_\Omega(m)$ for the specified class $m=\{1, \ldots, C\}$. The class-dependent set of training signals $\{x_i(m)\}_{i=1}^M$, $m=\{1, \ldots, C\}$ is labelled accordingly in FIG. 6.

Figure 7:
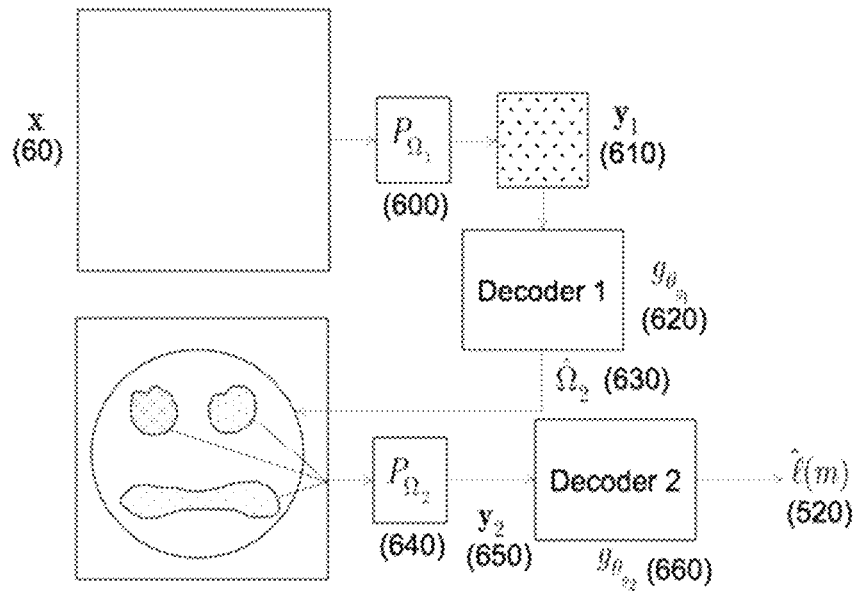
FIG. 7 shows a first embodiment of a multi-stage sampling-decoding framework according to the present invention.

FIG. 7 shows a first embodiment of a multi-stage sampling-decoding framework wherein the signal of interest x (60) is first sampled by the sampling operator $P_{\Omega_1}$ (600) producing a sampled signal $y_1$ (610) that might represent a low-resolution sampled version of the signal of interest x. The first decoder (620) produces an output (630) that might correspond to the detection region of some desired features that in turn might be sampled with different rates. One might consider a face detector from a low-resolution image as a specific example of this general approach. Finally, the sampling operator $P_{\Omega_2}$ (640) then samples the trained regions to produce the observation signal $y_2$ whereas the second decoder (660) performs the recognition/detection by producing an estimate (520). This example is mentioned mainly for illustrative purposes, given that one can apply different optimization strategies to this example in various applications which cannot all be mentioned here, the optimization moreover depending on the given energy consumption, exposure time, memory, complexity, security or privacy considerations for a given application. One can also envision application of the above described multi-stage sampling-decoding scenario to the case where different sensors perform sampling of different regions. Additionally, this scenario is illustrated in FIG. 7 for two stages only, whereas in practice multi-stage systems having several stages might be deployed to fulfill the targeted requirements. The overall cost functions at each stage might have different objectives, too.

Figure 8:
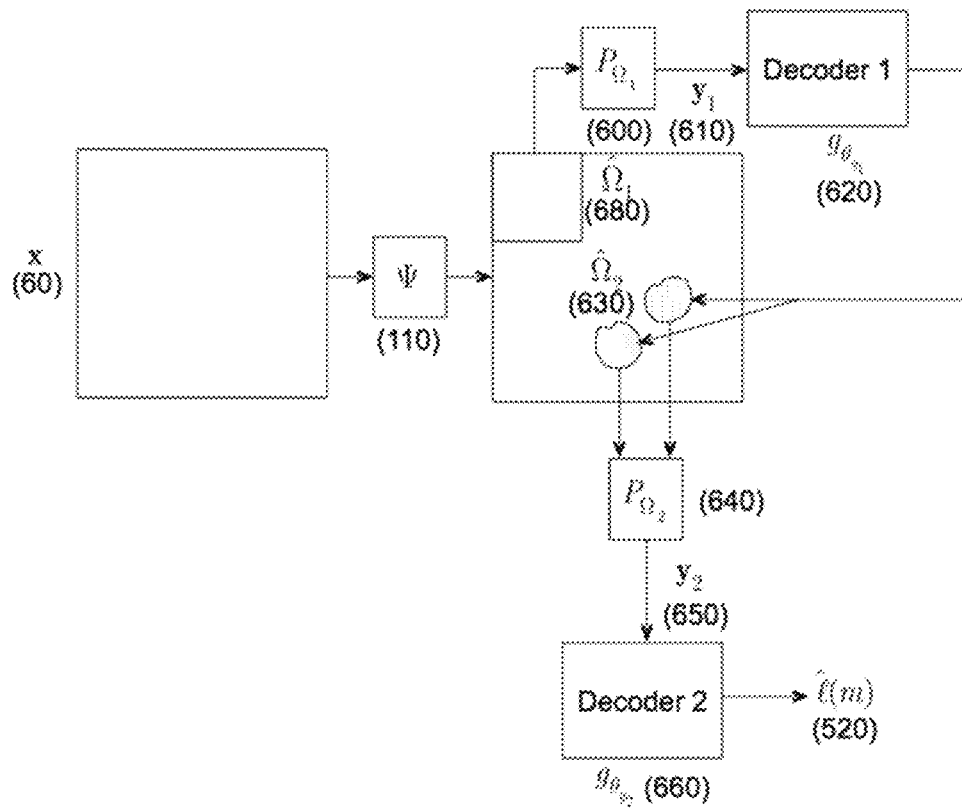
FIG. 8 shows a second embodiment of a multi-stage sampling-decoding framework which is extended as compared to the example of FIG. 7.

FIG. 8 shows a second embodiment of a multi-stage sampling-decoding framework which extends the example of FIG. 7 to a transform domain (670) with several sampling operators, wherein first the sampling using the sampling operator $P_{\Omega_1}$ (600) is performed in some domain (680) and the sampling using the sampling operator $P_{\Omega_2}$ (640) in another domain (630), based on the result of the first stage decoder 1 (620). For example, the first transform domain (680) may be chosen to be the identity operator $\Psi=I$, such that the first sampling using the sampling operator $P_{\Omega_1}$ (600) is performed in the spatial domain instead of in some transform spectral domain, whereas the next sampling using the sampling operator $P_{\Omega_2}$ (640) indeed is performed in a spectral domain (630).

The proposed method can be used in several kind of imaging applications. Without being exhaustive, only a few of a high number of potential applications will be considered explicitly in the following by way of example, bearing in mind that analoguous setups may easily be transposed by a person skilled in the art to applications not explicitly mentioned in the following.

Application of the method according to the present invention to medical imaging may include, but is not limited to, magnetic resonance imaging (MRI), computerized tomography (CT) and ultrasound imaging. In all these applications, the image is sampled in some transform domain $\Psi$ represented by physics of the corresponding imaging problem.

Non-destructive testing and imaging include applications where the sampling is performed in some transform domain $\Psi$ and one is interested to visualize the scene under investigation or to make some decision on that.

Sparse sensor arrays include numerous applications in radar, radioastronomy, acoustic arrays, surveillance systems and remote sensing applications.

Applications related to CCD and CMOS sensors include all professional, multimedia and specialized applications where use of huge amounts of pixels is limited or not desirable due to some technical limitations that include but are not limited by energy consumption, memory, communication burden, etc. Additionally, it might be interesting to use systems with larger size of sensors to increase the sensitivity without a big sacrifice in the resolution to cope with the photon noise. Moreover, one can also develop efficient sampling schemes adapted to the compression requirements of Big Data applications. Finally, one can also significantly benefit from the proposed sampling and the corresponding demosaicking as a kind of decoder in color imaging applications.

The invention is also of interest for classification and recognition applications when some object or human should be recognized from a limited number of samples. This situation is of interest not only from technical perspectives but also from security and privacy considerations. In particular, it is possible to construct a working system if the number of samples is just sufficient for performing a reliable identification or authentication, but is insufficient to reliably reconstruct the whole object or biometric parameters. Such a sampling is also of interest in order to develop new countermeasures against the adversarial attacks in machine learning. Additionally, it is possible to randomize the sets of sampling parameters $\Omega$ using secret keys jointly with sets of training signals. Additionally, it is possible to introduce permutation of acquired samples by way of an operator Q: $\mathbb{C}^n \rightarrow \mathbb{Q}^n$ in equation (1), which insures key-based permutations. In this way, one can create a non-differentiable operator preventing adversarial learning and attacks.

The proposed joint training of the sampling operator and of the decoder is also of interest for anticounterfeiting applications, in which case the sampling operator and the decoder are trained on a set of training signals consisting of authentic objects/biometrics and of fakes with the above mentioned binary authentication cost function. In this manner, the found sampling regions allow to quickly and reliably establish the authenticity of objects or identity of humans without need of providing the whole range sampling. Additionally, this leads to more efficient implementations and increased reliability.

Figure 9:
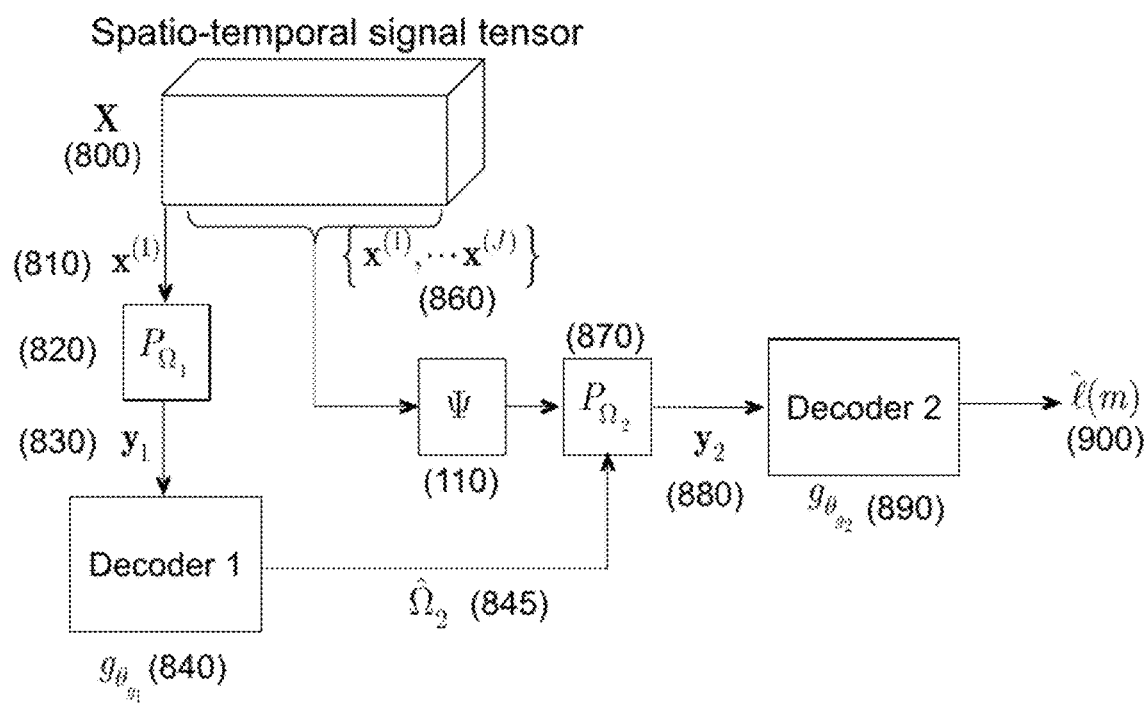
FIG. 9 illustrates application of multi-stage sampling to spatio-temporal signals.

Finally, the proposed invention has a wide range of applications for both image reconstruction and classification problems in case the signals of interest represent high-dimensional spatio-temporal tensors. In these cases, the proposed sampling method might be especially beneficial in comparison to prior art sampling methods. FIG. 9 illustrates application of multi-stage sampling to spatio-temporal signals (800). The signal of interest represented by tensor (800) is sampled in a first step in the spatio-temporal group $x^{(1)}$ (810) by the sampling operator $P_{\Omega_1}$ (820), producing observation signal $y_1$ (830). The decoder 1 (840) produces an estimate for the sampling operator $P_{\Omega_2}$ (870) applied in the next step of sampling to the spatio-temporal group $(x^{(2)}, \ldots, x^{(J)})$ (860), resulting in $y_2$ (880) and the decoder 2 (890) produces an estimate of class label (900). In general, the resulting decoder can also produce an estimate of the signal of interest x̂ depending on the targeted cost function.

Figure 10:
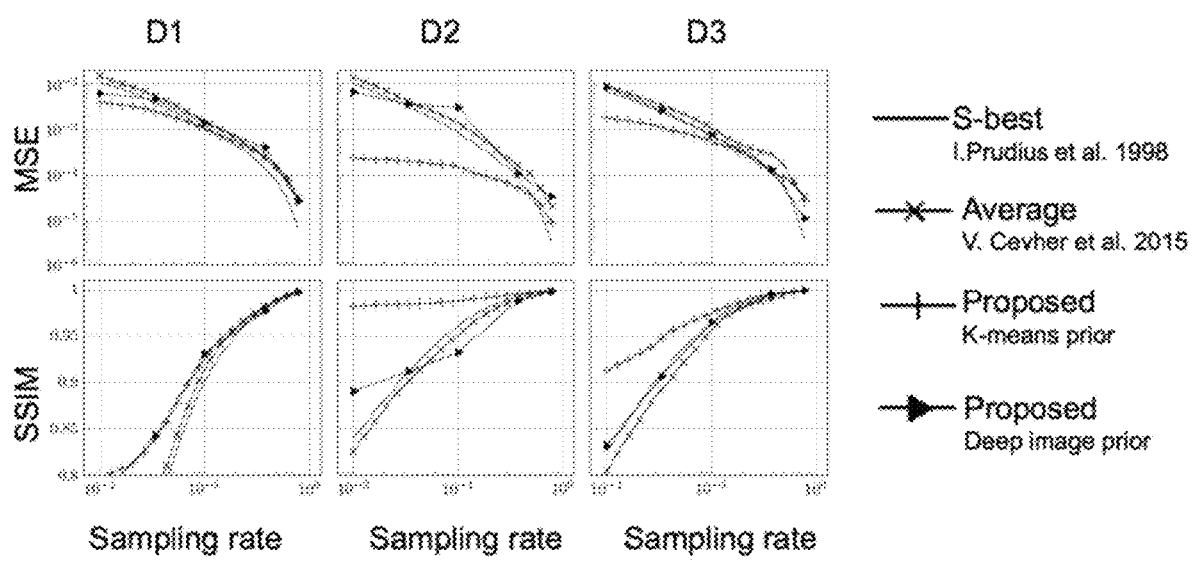
FIG. 10 presents the results of sampling and reconstruction for one medical (MRI) and two astronomical datasets of images denoted as D1, D2 and D3 for the Euclidean cost function for different sampling rates.

In order to illustrate the results that may be achieved by application of the method according to the present invention in comparison to prior art methods, FIG. 10 presents the results of sampling and reconstruction for one medical (MRI) and two astronomical datasets of images denoted as D1, D2 and D3, respectively, for the Euclidean cost function for different sampling rates. All images have been cropped to a size of 256×256 pixels. The results of two embodiments of the method according to the present invention, both based on learnable priors, are compared to the prior art on-fly S-best sampling method disclosed in the article "Robust image restoration matched with adaptive aperture formation in radar imaging systems with sparse antenna arrays" by I. Prudyus et al., denoted in FIG. 10 as "S-best", and to the prior art sampling method disclosed in the article "Learning-based subsampling" as well as in the document US 2017/0109650 by V. Cevher et al., denoted in FIG. 10 as "Average". The first embodiment of the method according to the present invention, denoted in FIG. 10 as "Proposed K-means prior", is based on the above described K-means learning of codebooks adapted to the Fourier spectral subbands of test image datasets having the same number of centroids per subband that can be itself a factor of additional optimization, leading to an additional performance enhancement. The second embodiment of the method according to the present invention, denoted in FIG. 10 as "Proposed Deep image prior", is based on the above mentioned decoder learning which, in the embodiment the results of which are shown in FIG. 10, uses deep learning, the latter being mentioned in the introduction and being as such known in prior art. The second embodiment is supposed to illustrate the potential use of deep learning methods within the limited training on external sets of training signals. In all cases, the traditional mean square error (MSE) computed between the original and reconstructed images was used to estimate the quality of reconstruction. Additionally, to reflect the aspect of human subjective perception of reconstructed image quality, the well-known SSIM metric known by a person skilled in the art was used. As is clearly visible in FIG. 10, both embodiments of the method according to the present invention comprising joint training of the sampling operator and decoder, even if using a very simple k-means model of trainable priors, significantly outperforms all tested methods for both the MSE and SSIM metrics. It should be noted here that the particular performance enhancement investigated on broader sets of images ranging from real life photos to specialized domain imagery depends on the uniformity of the data within the training datasets and its correspondence to the signals of interest. This highlights that proper training and use of learnable priors is beneficial and may greatly improve image sampling methods.

Figure 11:
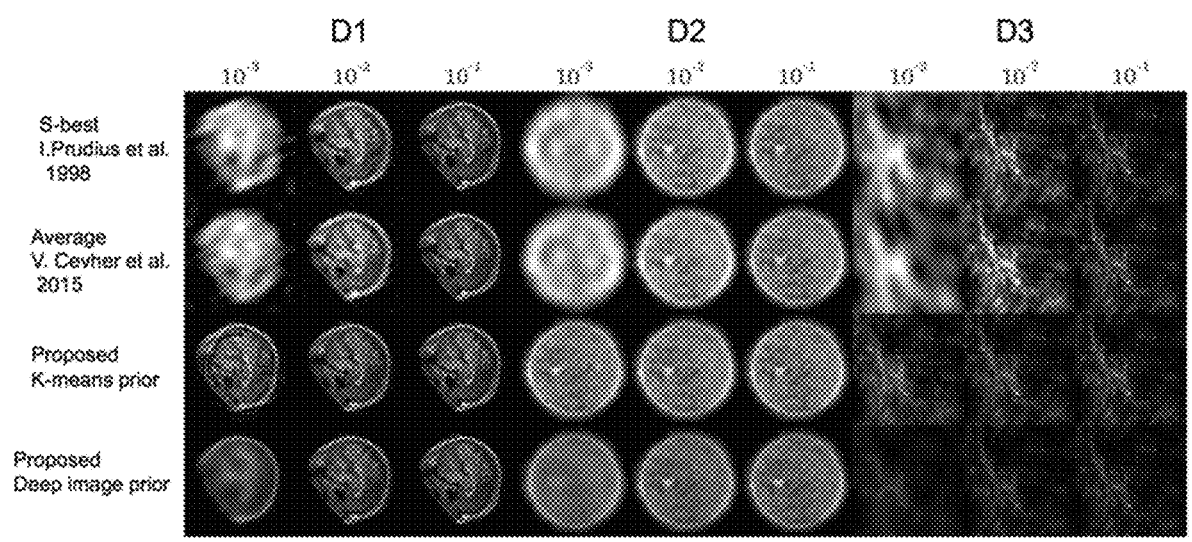
FIG. 11 illustrates some examples of images tested in order to obtain the results shown in FIG. 10.

For further illustration, FIG. 11 illustrates some examples of images that were tested, i.e. sampled, in order to obtain the results shown in FIG. 10. As suggested by the objective MSE and SSIM measures of FIG. 10, the quality of the images illustrated in FIG. 11, sampled and reconstructed for very small sampling rates, is significantly better for both embodiments of the method according to the present invention in comparison to the prior art S-best and Average techniques. The quality increases with the increase of the sampling rate, where all methods produce quite similar results.

Finally, it shall be noted here that the present invention also pertains to computer program means stored in a computer readable medium adapted to implement the above described method as well as to a device equipped with such computer program means. The device preferably is chosen from the group comprising a mobile phone, in particular a smart phone equipped with a camera, a digital photo apparatus, a digital video camera, a scanning device, a tablet or personal computer, a server.

In light of the above description of the method of signal sampling according to the present invention, its advantages are clear. In particular, due to the joint adaptation of the sampling operator and decoder to the training data, the method of signal sampling according to the present invention has a higher overall performance under a targeted cost function for a signal of interest acquired with a finite number of samples. This allows to reduce the number of samples in many applications that have constraints in terms of technology, cost, memory and exposure/observation time as well as in terms of health safety, security or privacy, etc. by simultaneously ensuring high quality of decoding. Furthermore, the joint training of the sampling operator and of the decoder allows, in contrast to prior art sampling methods, to avoid use of "hand-crafted" decoders, to provide improved decoders most adapted to the corresponding sampling operators, as well as to exploit training signals to its full power. Moreover, the proposed method allows to make a decision about a class of the signal of interest in recognition and identification applications and the training procedure of the sampling operator may be improved by taking into account in more precise manner as compared to prior art the predetermined properties of specific types of signals, for example of the kind of images, to be sampled and reconstructed, respectively classified.

The invention claimed is:
1. A method of sampling and decoding of a signal of interest x comprising:
   at a training stage, the steps of:
   acquiring a set of training signals $\{x_i\}_{i=1}^{M}$,
   providing a sampling operator $P_\Omega$ and a decoder $g_{\theta_g}(.)$,
   training said sampling operator $P_\Omega$ on said set of training signals $\{x_i\}_{i=1}^{M}$ to obtain a learned sampling operator $P_{\hat{\Omega}}$,
   training said decoder $g_{\theta_g}(.)$ jointly with said sampling operator $P_\Omega$ on said set of training signals $\{x_i\}_{i=1}^{M}$, to obtain a learned decoder $g_{\hat{\theta}_g}$, by jointly determining, during a cost minimization step of the training stage, a set of sampling parameters $\Omega$ and a set of decoding parameters $\theta_g$ according to a cost function, the cost minimization step being implemented by an optimization procedure iterated in alternative directions until convergence, and
   at a sampling stage, the steps of:
   applying during a sampling step the learned sampling operator $P_{\hat{\Omega}}$ in a transform domain $\Psi$ to the signal of interest x, resulting in observation signal y,
   applying during a decoding step the decoder $g_{\theta_g}(.)$ to the observation signal y, to produce an estimate x̂ of the signal of interest x in order to decode the signal and/or to make a decision about the signal,
   wherein applying the decoder $g_{\theta_g}(.)$ includes using said set of decoding parameters $\theta_g$, such that the estimate x̂ of the signal of interest x is produced by the learned decoder $g_{\hat{\theta}_g}$.
2. The method according to claim 1, wherein said optimization procedure iterated in alternative directions until convergence is based on:

an optimization of the estimate $\hat{x}$ of the signal of interest x and of the decoding parameters $\theta_g$, whilst keeping the set of sampling parameters $\Omega$ fixed, of the form $$\hat{x}_\Omega = \operatorname{argmin}_x \tfrac{1}{2}\|y - P_\Omega \Psi x\|_2^2 + \lambda_x \Omega_x(x),$$

where $\Omega_x(x)$ is a signal regularization prior, $\lambda_x$ is a regularization parameter and $\|.\|_2$ denotes the $l_2$-norm, and on
an optimization of the set of sampling parameters $\Omega$, whilst keeping the decoding parameters $\theta_g$ fixed, of the form $$\hat{\Omega} = \operatorname{argmin}_\Omega \sum_{i=1}^{M} \|x_i - \hat{x}_{\Omega i}\|_2^2 + \lambda_\Omega \Omega_\Omega(\Omega),$$

where $\Omega_\Omega(.)$ is a prior on desirable properties of the set of sampling parameters $\Omega$.

3. The method according to claim 1, wherein said optimization procedure iterated in alternative directions until convergence is based on an optimization of the general form:

$$(\hat{\Omega}, \hat{\theta}_g) =$$
$$\operatorname{argmin}_{\Omega,\theta_g} \sum_{p=1}^{P}\sum_{i=1}^{M} \tfrac{1}{2}\|x_i - g_{\theta_g}(P_\Omega \Psi(x_i + z_p))\|_2^2 + \gamma_1 \Omega_\Omega(\Omega) + \gamma_2 \Omega_{\theta_g}(\theta_g),$$

where the decoder $g_{\theta_g}(.)$ is factorized as a deep structure of a form $g_{\theta_g}(x) = \sigma_D^g(W_D^g \ldots \sigma_1^g(W_1^g(x)))$, with $\theta_g = (W_1^g, \ldots, W_D^g)$ being parameters of a deep network, $\sigma_k^g(.)$ standing for point-wise non-linearities k=1, ..., D with D denoting the number of layers, $\Omega_\Omega(\Omega)$ denoting constraints on the geometry and properties of the sampling operator $P_\Omega$, $\Omega_{\theta_g}(\theta_g)$ defining constraints on the decoder parameters, $\gamma_1$ and $\gamma_2$ being regularization parameters and $\|.\|_2$ denoting the $l_2$-norm.

4. The method according to claim 3, wherein said optimization procedure iterated in alternative directions until convergence is based on
an optimization of the decoding parameters $\theta_g$, whilst keeping the set of sampling parameters $\Omega$ fixed, of the form $$\hat{\theta}_g = \operatorname{argmin}_{\theta_g} \sum_{i=1}^{M} \tfrac{1}{2}\|x_i - g_{\theta_g}(P_\Omega \Psi(x_i))\|_2^2 + \gamma_1 \Omega_{\theta_g}(\theta_g),$$

and on
an optimization of the set of sampling parameters $\Omega$, whilst keeping the decoding parameters $\theta_g$ fixed, of the form $$\hat{\Omega} = \operatorname{argmin}_\Omega \sum_{i=1}^{M} \tfrac{1}{2}\|x_i - \hat{x}_{\Omega i}\|_2^2 + \lambda_1 \Omega_\Omega(\Omega).$$

5. The method according to claim 1, wherein the cost function used in the cost minimization step for determining the set of sampling—$\Omega$ and decoding parameters $\theta_g$ during the joint training of the sampling operator $P_\Omega$ and of the decoder $g_{\theta_g}(.)$ is of the general form $$(\hat{\Omega}, \hat{\theta}_g) = \operatorname{argmin}_{\Omega,\theta_g} \sum_{p=1}^{P}\sum_{i=1}^{M}\sum_{m=1}^{C} L(l(m)),$$
$$g_{\theta_g}(P_\Omega \Psi(x_i + z_p))) + \gamma_1 \Omega_\Omega(\Omega) + \gamma_2 \Omega_{\theta_g}(\theta_g),$$

wherein the decoder $g_{\theta_g}(.)$ is a classifier $g_{\theta_g}: \mathbb{R}^n \to \{1, \ldots, C\}$, $\Omega_\Omega(\Omega)$ denotes constraints on the geometry and properties of the sampling operator $P_\Omega$, $\Omega_{\theta_g}(\theta_g)$ denotes constraints on the decoder parameters, $\gamma_1$ and $\gamma_2$ being regularization parameters and l(m) is an encoded class label for the class $g_{\theta_g}: \mathbb{R}^n \to \{1, \ldots, C\}$, with L(.) denoting the cost function.

6. The method according to claim 1, wherein both the sampling operator $P_\Omega$ and the decoder $g_{\theta_g}(.)$ are realized on multiple stages.

7. The method according to claim 1, wherein the sampling operator $P_\Omega$ is repartitioned into several subbands which are optimized to the properties of the set of training signals $\{x_i\}_{i=1}^{M}$ and of the decoder $g_{\theta_g}(.)$ according to a chosen cost function and/or into several transform domains $\Psi$.

8. The method according to claim 1, wherein the sampling operator $P_\Omega$ is specifically adapted for a transform domain $\Psi$ representing a color space transformation by performing the sampling in each color component of said color space transform domain $\Psi$.

9. The method according to claim 1, wherein the sampling operator $P_\Omega$ has a reduced sampling rate such as to ensure privacy-preserving sampling of the signal of interest x in remote or on-device authentication and identification applications.

10. The method according to claim 1, wherein the sampling operator $P_\Omega$ is designed such as to depend on both the set of training signals $\{x_i\}_{i=1}^{M}$ and a secret key and/or a product ID to ensure a secret subset sampling in order to prevent counterfeiting and adversarial attacks.

11. The method according to claim 1, wherein the joint training of the sampling operator $P_\Omega$ and of the decoder $g_{\theta_g}(.)$ is performed based on a class of training signals corresponding to genuine groups of objects, products or persons and non-genuine ones, optimization of a cost function ensuring an optimal distinguishability of genuine from non-genuine classes.

12. The method according to claim 1, wherein the joint training of the sampling operator $P_\Omega$ and of the decoder $g_{\theta_g}(.)$ is performed based on a set of training signals $\{x_i\}_{i=1}^{M}$ representing the same objects under different viewing and imaging conditions.

13. The method according to claim 1, wherein the joint training of the sampling operator $P_\Omega$ and of the decoder $g_{\theta_g}(.)$ uses a model of the signal of interest x which is based on an auto-encoder comprising a model encoder and decoder pair and implemented by taking into account compressive and/or robustification constraints in the space of latent representation.

14. The method according to claim 1, wherein the joint training of the sampling operator $P_\Omega$ and of the decoder $g_{\theta_g}(.)$ uses a model of the signal of interest x which is based on a single learnable orthonormal or overcomplete representation or a deep learning representation which either is also trained based on the set of training signals $\{x_i\}_{i=1}^{M}$ or is trained on the fly.

15. The method according to claim 1, wherein the set of training signals $\{x_i\}_{i=1}^{M}$ comprises both clean and distorted and/or corrupted signals, the joint training of the sampling operator $P_\Omega$ and of the decoder $g_{\theta_g}(.)$ ensuring selection of the most informative and distinguishable sets of sampling—$\Omega$ and decoding parameters $\theta_g$.

16. A computer program means stored in a tangible computer readable medium adapted to implement the method according to claim 1.

17. A device equipped with the computer program means according to claim 16, wherein the device is chosen from a group comprising a mobile phone equipped with a camera, a digital photo apparatus, a digital video camera, a scanning device, a tablet or personal computer, and a server.

* * * * *